(12) United States Patent
Findlay et al.

(10) Patent No.: US 8,928,893 B2
(45) Date of Patent: Jan. 6, 2015

(54) PROXIMITY SENSOR

(75) Inventors: Ewan Findlay, Dollar (GB); Colin Campbell, Strathaven (GB); Gemma Ramsey, Glasgow (GB); Eric Saugier, Lancey (FR)

(73) Assignees: STMicroelectronics (Research & Development) Limited, Marlow, Buckinghamshire (GB); STMicroelectronics (Grenoble 2) SAS, Grenoble (FR)

( * ) Notice: Subject to any disclaimer, the term of this patent is extended or adjusted under 35 U.S.C. 154(b) by 660 days.

(21) Appl. No.: 13/242,708

(22) Filed: Sep. 23, 2011

(65) Prior Publication Data

US 2012/0133956 A1 May 31, 2012

(30) Foreign Application Priority Data

Nov. 30, 2010 (GB) .................................. 1020284.4

(51) Int. Cl.
| | | |
|---|---|---|
| G01B 11/14 | (2006.01) | |
| G02B 27/00 | (2006.01) | |
| G01J 1/44 | (2006.01) | |
| H04B 10/00 | (2013.01) | |
| H04B 10/08 | (2006.01) | |
| H01L 31/173 | (2006.01) | |
| H01L 31/12 | (2006.01) | |
| H03K 17/94 | (2006.01) | |
| H01L 25/16 | (2006.01) | |
| H03K 17/945 | (2006.01) | |

(52) U.S. Cl.
CPC ............ *H03K 17/941* (2013.01); *H01L 31/173* (2013.01); *H01L 31/125* (2013.01); *H01L 25/167* (2013.01); *H03K 2217/94108* (2013.01); *H03K 2017/9455* (2013.01)
USPC .................... 356/614; 250/551; 250/214 AL; 398/130; 398/128; 398/15; 455/73; 257/E27.128; 257/E31.128

(58) Field of Classification Search
CPC ........ G01D 5/305; G01D 5/34; H01L 31/167; H01L 2924/1815; H01L 2224/48091; H01L 2924/00014; G06F 3/0488; H04M 2250/22; H04M 1/7253
USPC ............ 356/614; 250/551, 214 AL; 398/130, 398/128, 15
See application file for complete search history.

(56) References Cited

U.S. PATENT DOCUMENTS

| | | |
|---|---|---|
| 4,835,595 A | 5/1989 | Oho et al. |
| 4,972,089 A | 11/1990 | Stevenson |

(Continued)

FOREIGN PATENT DOCUMENTS

| | | |
|---|---|---|
| DE | 10201746 A1 | 8/2002 |
| EP | 1351319 A2 | 10/2003 |

(Continued)

OTHER PUBLICATIONS

UK Search Report mailed Mar. 23, 2011 for GB 1020284.4 (2 pages).

*Primary Examiner* — Tarifur Chowdhury
*Assistant Examiner* — Sunghee Y Gray
(74) *Attorney, Agent, or Firm* — Gardere Wynne Sewell LLP

(57) ABSTRACT

The internal propagation of radiation between a radiation source and radiation detector mounted within a sensor package is prevented by the use of an optical isolator. The optical isolator is formed by the combination of a baffle mounted between the source and detector and a groove formed in an upper surface of the sensor package between the source and detector. A bottom of the groove is positioned adjacent to an upper edge of the baffle.

35 Claims, 15 Drawing Sheets

(56) References Cited

U.S. PATENT DOCUMENTS

| | | |
|---|---|---|
| 5,130,531 A | 7/1992 | Ito et al. |
| 5,340,993 A | 8/1994 | Salina et al. |
| 5,382,810 A | 1/1995 | Isaksson |
| 5,448,395 A | 9/1995 | Lopez et al. |
| 5,684,294 A | 11/1997 | Kouhi |
| 6,594,043 B1 | 7/2003 | Bloom et al. |
| 7,123,154 B1 | 10/2006 | Smith |
| 7,161,136 B1 | 1/2007 | Wenstrand et al. |
| 7,196,316 B2 * | 3/2007 | Chan et al. .................. 250/221 |
| 7,262,402 B2 | 8/2007 | Niclass et al. |
| 7,309,855 B2 | 12/2007 | Nagasaka et al. |
| 7,375,803 B1 | 5/2008 | Bamji |
| 7,554,076 B2 | 6/2009 | Wang et al. |
| 7,617,980 B2 | 11/2009 | Saxena et al. |
| 7,737,394 B2 | 6/2010 | Ovsiannikov et al. |
| 8,228,410 B2 | 7/2012 | Raynor et al. |
| 2004/0012029 A1 | 1/2004 | Bawolek et al. |
| 2006/0016970 A1 * | 1/2006 | Nagasaka et al. ........ 250/231.13 |
| 2006/0091293 A1 | 5/2006 | Grueger et al. |
| 2006/0146330 A1 | 7/2006 | Maniam |
| 2007/0212681 A1 | 9/2007 | Shapiro et al. |
| 2008/0006762 A1 | 1/2008 | Fadell et al. |
| 2008/0219672 A1 | 9/2008 | Tam et al. |
| 2008/0225140 A1 | 9/2008 | Raynor et al. |
| 2009/0219432 A1 | 9/2009 | Palum et al. |
| 2009/0234248 A1 * | 9/2009 | Zand et al. .................... 600/587 |
| 2009/0302329 A1 | 12/2009 | Noma et al. |
| 2010/0085468 A1 | 4/2010 | Park et al. |
| 2010/0127159 A1 | 5/2010 | Watanabe |
| 2010/0277075 A1 | 11/2010 | Rees |
| 2010/0282953 A1 | 11/2010 | Tam |
| 2011/0057129 A1 | 3/2011 | Yao et al. |
| 2011/0086676 A1 | 4/2011 | Choi et al. |
| 2012/0074322 A1 | 3/2012 | Skurnik |
| 2012/0087645 A1 | 4/2012 | Wu et al. |
| 2012/0132788 A1 | 5/2012 | Findlay |
| 2013/0341494 A1 | 12/2013 | Fadell et al. |

FOREIGN PATENT DOCUMENTS

| | | |
|---|---|---|
| EP | 1764835 A1 | 3/2007 |
| JP | 10154825 A | 6/1998 |
| JP | 11261493 A | 9/1999 |
| JP | 11289105 A | 10/1999 |
| WO | WO-2009022282 A2 | 2/2009 |
| WO | WO-2009120568 A2 | 10/2009 |
| WO | WO-2010032306 A1 | 3/2010 |

* cited by examiner

PROXIMITY SENSOR

PRIORITY CLAIM

The present invention claims priority from United Kingdom Application for Patent No. 1020284.4 filed Nov. 30, 2010, the disclosure of which is hereby incorporated by reference.

TECHNICAL FIELD

The disclosure relates to a proximity sensor, a method of manufacturing a proximity sensor, a mobile communications device comprising a proximity sensor and a method of proximity detection.

BACKGROUND

Proximity sensors typically comprise a radiation source and a corresponding detector, the detector comprising a relatively small number of exposed radiation sensitive pixels (from a single pixel up to, for example, a 10×10 pixel array). At its simplest the proximity sensor is capable of indicating the presence or absence of a user or object. Additional computation and circuit complexity can provide enhanced data such as the range to an object.

Proximity sensing is achieved by: emitting radiation from the source; capturing radiation which is reflected back to the detector by an object; and processing the reflected radiation to determine the proximity of the object to the sensor. Proximity sensors are used in many applications, including on mobile communications devices and vehicle parking sensors.

The source and the detector of existing proximity sensors are typically provided in separate packages with separate control circuitry. However, it is desirable to reduce their size and complexity.

SUMMARY

A first aspect of the disclosure provides a proximity sensor comprising: a sensor package comprising a lens module; a radiation source and a radiation detector housed within the sensor package; the lens module of the sensor package being positioned over the source and the detector; and an optical isolator for substantially preventing the internal propagation of radiation between the source and the detector within the sensor package, the optical isolator comprising: a baffle; and a groove formed in the upper surface of the lens module, the bottom of the groove being adjacent an upper edge of the baffle.

By substantially preventing the propagation of radiation between the source and the detector, the source and detector can be mounted within a single sensor package. That is, the sensor package is provided as a single discrete package which can be provided to a customer as a single working entity. This allows common circuitry to be employed for control of source and detector which reduces the complexity of the sensor (compared to a sensor comprising separately packaged source and detector which typically requires separate circuitry for each). In addition, the footprint of such a package is significantly smaller than the combination of separately packaged sources and detectors. There is also a cost advantage to housing the source and detector in a single package.

Typically the optical isolator is between the source and the detector.

Preferably, the baffle is opaque to radiation emitted by the radiation source. In one embodiment, the baffle may be substantially planar. Alternatively the baffle may be concave with respect to the radiation source to reflect radiation back towards the radiation source.

Typically a substantially planar attachment pad is housed within the sensor package. In this case, the radiation source and the radiation detector are typically held in fixed relation to the attachment pad. In one embodiment, the source and the detector are mounted on (and optionally bonded to) the attachment pad. Additionally or alternatively, the baffle is preferably mounted or formed on the attachment pad. In a preferred embodiment, the baffle is substantially planar and the plane of the baffle is preferably substantially perpendicular to the plane of the attachment pad.

Where the sensor package comprises a lens module and a baffle, the lens module typically comprises a recess for receiving a portion of the baffle. In one embodiment, the baffle may extend from the attachment pad into the lens module recess. In this case, as well as acting as an optical isolator, the baffle also acts as a locating feature which aids the assembly of the lens module.

A single groove may be provided in the upper surface of the lens module. Alternatively, the optical isolator may comprise a plurality of grooves formed in the upper surface of the lens module. In one embodiment, the groove(s) are V-shaped. In this case, the plurality of grooves may be configured in a saw tooth structure.

The lens module preferably comprises first and second lenses.

The lens module is typically formed as a single part.

Where the lens module is formed as a single part and comprises first and second lenses, the single part construction ensures accurate alignment is maintained between the first and second lenses. Preferably, the lenses are aligned to provide the source with an emission cone having a principle optical axis which is parallel to the principle optical axis of the incident cone of the detector. Additionally, or alternatively, the lenses are aligned such that the emission cone overlaps the incident cone. In one embodiment, the emission cone is substantially within the incident cone, or vice versa. In each case, the alignment of the lenses allows the detector to 'see' any targets illuminated within the emission cone.

In one embodiment, the lens module may be split into first and second parts. Preferably, the first part is not directly connected to the second part. Typically the first and second parts are separated by one or more channels, the channel(s) forming part of the optical isolator.

Typically, the first part of the lens module may comprise a first lens, while the second part of the lens module may comprise a second lens.

The lens module may be formed as a single part before being cut into first and second parts after the single part lens module has been fitted over the attachment pad during assembly.

In one embodiment, the optical isolator may comprise one or more reflectors within the lens module. The reflectors may be straight but preferably the reflectors are curved. In one embodiment, the reflectors are concave with respect to the source to reflect incident radiation back to the source. Preferably the reflectors extend between upper and lower surfaces of the lens module.

In a preferred embodiment, one or more selected portions of the lens module are covered by a material opaque to radiation emitted by the radiation source. The opaque material absorbs stray radiation which could otherwise be reflected within the package. This reduces the stray radiation which could pollute the proximity sensing signal detected by the detector.

In one embodiment, where the sensor package comprises an attachment pad and a lens module (see above), the sensor package further comprises a lens module mount formed around the perimeter of the attachment pad and extending between the attachment pad and the lens module. Preferably at least part of the lens module mount is opaque to radiation emitted by the radiation source. The optical isolator may be configured to reflect/deflect radiation towards the lens module mount (where it may be absorbed).

In a preferred embodiment, the optical isolator comprises a baffle extending from an attachment pad (or alternatively from a lens module mount where one is provided) into a corresponding recess formed in a lower surface of the lens module. In addition, the optical isolator may further comprise a groove formed in an upper surface of the lens module. In this case, the groove in the upper surface of the lens module is typically adjacent the recess formed in the lower surface of the lens module. Preferably, the shortest distance between the lower surface of the lens module and the bottom of the groove in the upper surface of the lens module is less than the shortest distance between the lower surface of the lens module and an upper edge of the baffle. Said groove may be V-shaped, but preferably the groove may be U-shaped. If the groove is U-shaped, the groove edges may or may not be squared off.

In another embodiment, an upper edge of the baffle is substantially flush with an upper surface of the lens module. In this case, grooves may or may not be required.

The radiation source may be mounted at the bottom of a well comprising an aperture. The well restricts the emission cone of the source. The well may be formed on the attachment pad where one is provided. In one embodiment, the lens module comprises a lens positioned over the aperture for collimating radiation emitted by the radiation source through the aperture. Additionally or alternatively the lens module may further comprise a second lens positioned over the radiation detector. The second lens preferably focuses incident radiation onto the detector.

The radiation detector typically comprises a pixel array. The pixel array may be an array of silicon photodiodes configured in the photoconductive mode. Alternatively the pixel array may be an array of single photon avalanche diodes (SPADs). It will be understood that any suitable radiation sensitive pixels may be used.

Preferably, common circuitry is housed within the sensor package for controlling the source and the detector. This is possible because the source and the detector are provided in a single package. If the source and the detector were provided in separate packages, separate source and detector circuitry would need to be provided in the respective packages. Thus, packaging the source and detector in the same single package reduces the complexity of the proximity sensor.

Typically, the optical isolator substantially prevents the propagation of radiation between the source and the detector by total internal reflection within the sensor package.

A second aspect of the disclosure provides a method of manufacturing a proximity sensor comprising: (a) housing a radiation source and a radiation detector within a sensor package; (b) fitting or forming a lens module over the source and the detector; and (c) forming an optical isolator for substantially preventing the internal propagation of radiation between the radiation source and the radiation detector within the sensor package, including mounting or forming a baffle between the source and the detector and forming one or more grooves in an upper surface of the lens module, the bottom of at least one of the one or more grooves being adjacent an upper edge of the baffle.

In one embodiment, step (a) comprises bonding the source and the detector to a substantially planar attachment pad housed within the package. In this case, the baffle may be formed on, or attached to, the attachment pad.

In one embodiment, the method according to the second aspect of the disclosure further comprises fitting or forming a lens module over the attachment pad. Preferably, the lens module is formed as a single part.

For example but not exclusively, the lens module may be formed by encapsulating the source and detector in a material which is transparent to radiation emitted by the source. The encapsulant material may, for example but not exclusively, comprise silicone or epoxy.

The source may be an off-the-shelf (modulated) LED or semiconductor laser. However, in a preferred embodiment the source is a bare die light emitting diode. In this case, the manufacturer of the sensor package is provided with greater control to align the radiation source with the detector, without having to account for manufacturing tolerances in the radiation source packaging.

Preferably, where a lens module is provided, it comprises a first lens positioned over the radiation source and a second lens positioned over the radiation detector.

Preferably, the method further comprises covering selected portions of the lens module with material opaque to radiation emitted by the radiation source.

In one embodiment, the method may further comprise, before step (a), forming a well on the attachment pad and, during step (a), mounting the radiation source at the bottom of the well. The well restricts the emission cone of the radiation source which improves the reliability of the proximity sensor.

A third aspect of the invention provides a mobile communications device comprising a proximity sensor having: a sensor package comprising a lens module; a radiation source and a radiation detector housed within the sensor package, the lens module of the sensor package being positioned over the source and the detector; and an optical isolator for substantially preventing the internal propagation of radiation between the source and the detector within the sensor package, the optical isolator comprising: a baffle; and a groove formed in the upper surface of the lens module, the bottom of the groove being adjacent an upper edge of the baffle.

A fourth aspect of the disclosure provides a method of proximity detection comprising: (a) providing a source and a detector within a single sensor package, the sensor package comprising a lens module positioned over the source and detector; (b) emitting radiation from the source; (c) substantially preventing the internal propagation of radiation between the source and the detector within the sensor package using an optical isolator comprising: a baffle; and a groove formed in the upper surface of the lens module, the bottom of the groove being adjacent an upper edge of the baffle; (d) illuminating an object outside the sensor package with a portion of the emitted radiation; (e) detecting a portion of the emitted radiation reflected by the object; and (f) processing the detected radiation to determine the proximity of the object to the sensor package.

As described above, the optical isolator may comprise a baffle between the source and the detector. Additionally or alternatively, the optical isolator may be provided by one or more grooves in the sensor package. Additionally or alternatively, the sensor package may comprise a lens module provided over the source and the detector, the lens module being split into separate first and second parts. In this case, the first and second parts are typically separated by one or more channels, the channels forming at least part of the optical isolator.

BRIEF DESCRIPTION OF THE DRAWINGS

An embodiment of the disclosure will now be described, by way of example only, with reference to the drawings, in which.

DETAILED DESCRIPTION OF THE DRAWINGS

Packaging a radiation source and detector of a proximity sensor together in a single package would allow both the source and detector to be controlled by common circuitry. This would reduce the complexity of the sensor. In addition, the proximity sensor package could be provided to a customer as a single working entity, while the footprint of such a package may be significantly smaller than the combination of separately packaged sources and detectors. However, there is a danger that radiation emitted by the source would internally propagate within the sensor package from the source onto the detector. This radiation would pollute the response of the radiation detector to the reflected radiation it captures during proximity detection. Packaging solutions are therefore required which either minimize or substantially prevent this effect.

Figure 1:
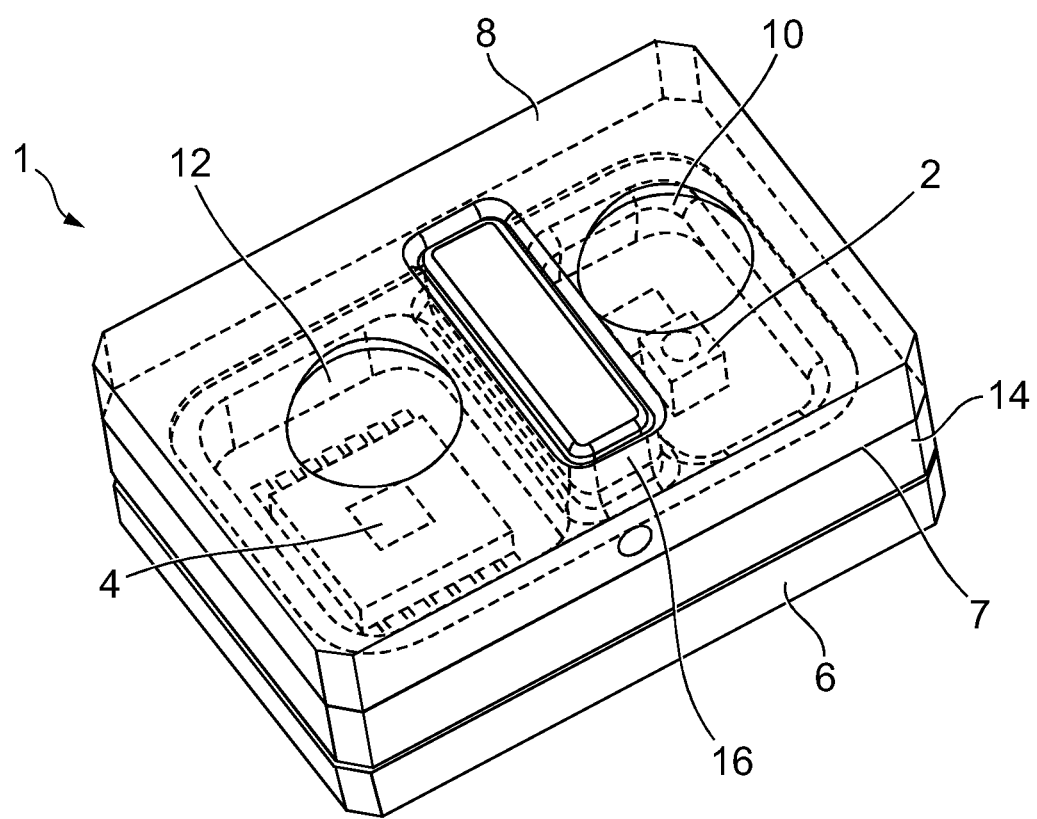
FIG. 1 is a perspective view of a sensor package according to the disclosure.

FIG. 1 is a schematic perspective view of a proximity sensor package 1 comprising a radiation source 2 and a radiation detector 4 mounted on (and optionally bonded to) a substantially planar attachment pad 6. A lens module 8 comprising a first lens 10 and a second lens 12 is fitted to an opaque (i.e., opaque to radiation emitted by the radiation source 2) lens module mount 14 which extends around the perimeter of, and is bonded to, the attachment pad 6. An opaque (i.e., opaque to radiation emitted by the source 2) baffle 16 is positioned between the source 2 and the detector 4 and extends upwards from the attachment pad 6 into a recess formed in the lower surface 7 of the lens module 8. In the embodiment of FIG. 1, the baffle 16 is integrally formed with the lens module mount 14.

The radiation source 2 and/or the radiation detector 4 need not necessarily be mounted directly to the attachment pad 6. However, it will be understood that both the source and the detector 4 are typically held in a fixed relation to the pad 6. The radiation source 2 may be an infrared source such as a modulated light emitting diode (LED) or semiconductor laser, while the detector 4 may comprise a single radiation sensitive pixel or a plurality of radiation sensitive pixels (e.g. silicon photodiodes configured in conductive mode, or single photon avalanche detectors—see below).

The package 1 further comprises common circuitry housed within the detector chip for controlling both the source 2 and the detector 4—that is the circuitry sets up the timing of the signal emission and detection. The circuitry can also be used to apply a modulation signal to the source 2.

The lens module 8 is positioned over the attachment pad. More specifically, the first lens 10 is positioned over the radiation source 2 and the second lens 12 is positioned over the detector 4. The first lens 10 acts as a collimator lens for collimating radiation emitted by the source 2, while the second lens 12 acts as a collection lens for focusing incident radiation onto the detector 4. The lens module 8 may be formed as a single part before being fitted to the lens module mount 14 in a single assembly step. This single part construction ensures that alignment accuracy is maintained between the emission and incident viewing cones of the first and second lenses 10, 12 respectively (and thus those of the source 2 and the detector 4 respectively).

It will be understood that the lens module 8 may alternatively be formed by encapsulating the attachment pad 6, source 2, detector 4, lens module mount 14 and baffle 16 with an optical encapsulant (such as epoxy or silicone) using a post die bond encapsulant machine. The lenses 10, 12 may be formed during manufacture. In this case, the source 2 may be a bare die LED. This provides the manufacturer of the sensor package with greater control to align the radiation source with the detector, without having to account for manufacturing tolerances in the radiation source packaging.

The baffle 16 acts as an optical isolator for substantially preventing the internal propagation of radiation between the source 2 and the detector 4 within the sensor package. That is, radiation emitted from the source 2 which is incident on the baffle 16 may either be absorbed by the (opaque) baffle 16 or reflected out of the package 1 or onto the (opaque) lens module mount 14 (where it may be absorbed).

The inventor has discovered that, in the absence of the baffle 16, approximately 4% of the radiation emitted by the radiation source 2 follows internal optical paths within the sensor package before landing on the detector 4. Conversely, approximately $10^{-3}$% of the radiation emitted by the radiation source reflects back to the detector 4 from a Lambertian target of reflectivity of 10% outside the package within the proximity sensing range (typically 0.01 m to 0.5 m). Thus, without the baffle 16, it would not be possible to distinguish the reflected signal from the polluting signal. This would make proximity sensing extremely (if not completely) unreliable.

Although the baffle 16 is described as being integrally formed with the lens module mount 14, it will be understood that the baffle 16 may alternatively be a separate part bonded onto the attachment pad 6 (or onto the lens module mount 14) before the lens module 8 is mounted (or formed) on the package. As another alternative, the baffle 16 may be formed from unused material on the attachment pad 6.

It will be understood that, as well as acting as an optical isolator, the baffle 16 also acts as a locating feature which ensures that the lens module 8 is properly aligned with the lens module mount 14 before being fitted/bonded during assembly. This is because the lens module 8 may only be securely fitted to the lens module mount 14 when the recess in the lower surface of the lens module 8 is properly aligned with the baffle 16.

Figure 2:
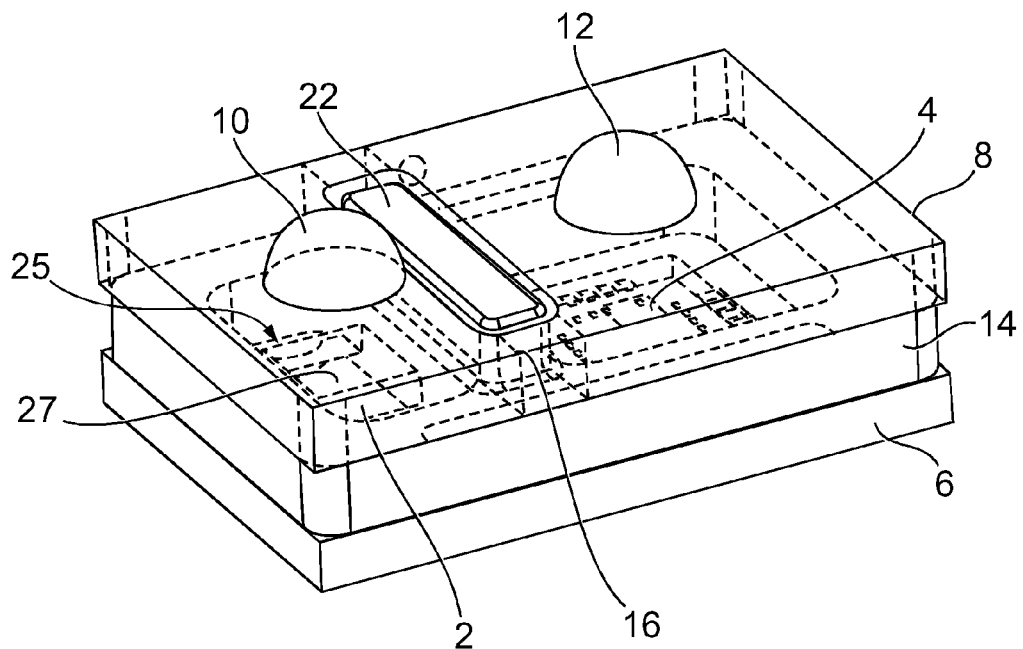
FIG. 2 is a perspective view of a similar sensor package to that of FIG. 1, where the source is mounted at the bottom of a well formed on the attachment pad.

As shown in FIG. 2, the radiation source 2 may be surrounded by a well 25 formed (or mounted) on the attachment pad 6. The well 25 comprises a proximal end bonded to (or integrally formed with) the attachment pad 6 and a hollow body which extends upwards from the attachment pad 6 to a distal end comprising an aperture 27 aligned beneath the lens 10 (i.e., the lens is positioned over the aperture 27). The well 25 may optionally comprise a base bonded to the attachment pad 6 onto which the radiation source 2 is mounted. The purpose of the well 25 is to restrict the size of the emission cone of the source 2. This helps to minimize the quantity of stray radiation within the package 1 which could potentially pollute the proximity detection signal captured by the detector when the sensor is in use (see below).

Figure 3:
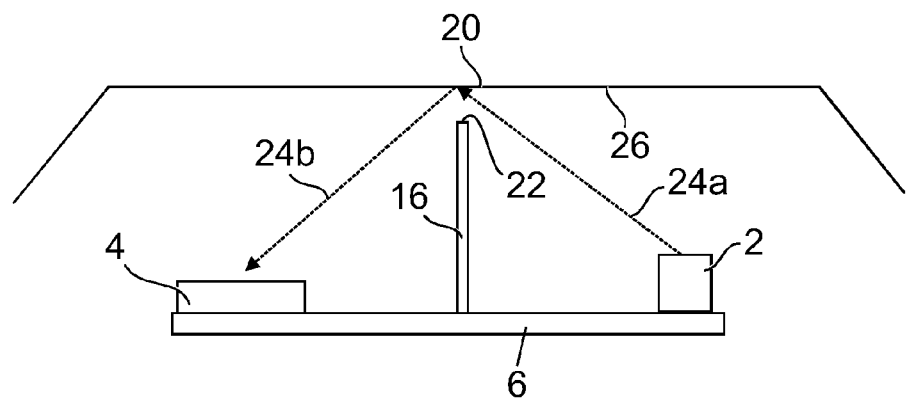
FIG. 3 is a schematic section view through the sensor package of FIG. 1.

To maintain the structural integrity of the package, the baffle 16 may be contained within the upper surface 20 of the lens module 8 (see FIG. 3). That is, an upper edge 22 of the baffle 16 may be positioned beneath the upper surface 20 of the lens module 8. This is shown most clearly in FIG. 3, which is a schematic section view showing the attachment pad 6, source 2, detector 4, baffle 16 and the upper surface 20 of the lens module 8. Despite the baffle 16, an internal optical path 24*a*, 24*b* (shown in FIG. 3) remains within the sensor package (substantially within the lens module 8) between the source 2 and the detector 4. In particular, radiation emitted by the source 2 along an emission portion 24*a* of the optical path 24*a*, 24*b* passes through a gap between the upper edge 22 of the baffle 16 and the upper surface 20 of the lens module 8 before being totally internally reflected by the underside 26 of the upper surface 20. After total internal reflection, the reflected radiation is directed along a reflection portion 24*b* of the optical path towards, and ultimately onto, the detector 4. It is noted that internal optical paths other than total internal reflection paths may also exist within the sensor package.

Figure 4:
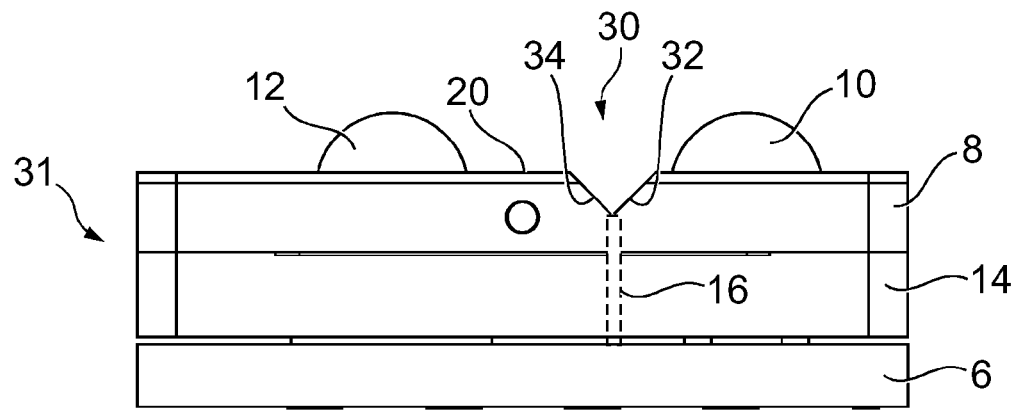
FIG. 4 is a side view of a sensor package with an optical isolator comprising a baffle and a V-shaped groove.
Figure 5:
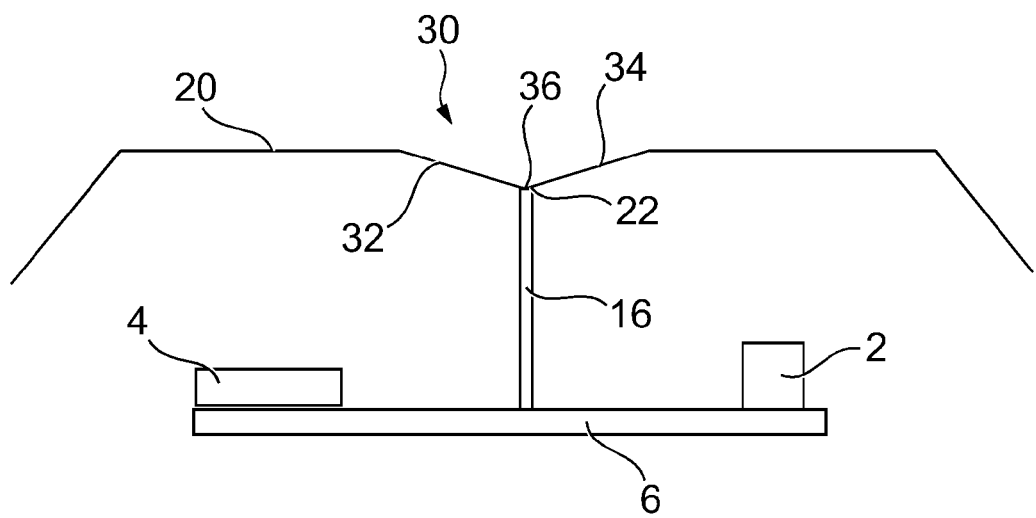
FIG. 5 is a schematic section view of the sensor package of FIG. 4.

As shown in FIGS. 4 and 5, a V-shaped groove 30 may be formed in the upper surface 20 of the lens module 8 above the baffle 16. The groove 30 may comprise first and second walls 32, 34 which are substantially perpendicular to each other. In the embodiment of FIGS. 4 and 5, the walls 32, 34 meet at a groove vertex 36 at the bottom of the groove, the vertex 36 being positioned adjacent the upper edge 22 of the baffle 16. The baffle remains contained within the lens module 8, while the gap between the upper surface 20 of the lens module 8 and the upper edge 22 of the baffle 16 is substantially removed.

The groove 30 and the baffle 16 together act as an optical isolator to substantially prevent the internal propagation of radiation between the source 2 and the detector 4 within the sensor package. More specifically, radiation emitted by the source 2 towards the (opaque) baffle 16 may be absorbed or reflected out of the package or back towards the source 2 as before. In addition, any radiation emitted by the source 2 towards the first wall 32 will propagate through the wall 32 and out of the package. As the first wall 32 is substantially perpendicular to (or within 10° of) the emission portion 24*a* of the internal optical path 24*a*, 24*b*, it will not totally internally reflect the radiation back into the package. In addition, as the second wall 34 is substantially parallel to the emission portion 24*a* of the optical path 24*a*, 24*b*, when a radiation ray exits the package through the first wall 32, the ray makes a grazing incidence with the second wall 34. This prevents the second wall 34 from totally internally reflecting the radiation back into the package.

In an alternative embodiment, the walls 32, 34 may extend at an (acute) angle from an intermediate position of the baffle 16 between the attachment pad 6 and the upper edge 22 of the baffle 16 to the upper surface 20 of the lens module 8. In this case, the upper edge 22 of the wall protrudes upwards through the upper surface 20 of the lens module 8.

In another alternative embodiment, the groove vertex 36 may be positioned above the upper edge 22 of the baffle 16. In this case, although groove 30 reduces the size of the gap between the upper edge 22 of the baffle 16 and the upper surface 20 of the lens module 20, a gap remains between the upper edge 22 of the baffle 16 and the vertex 36. Since radiation is typically emitted from the radiation source 2 in many different directions, there are typically many different internal, reflective optical paths within the sensor package along which radiation may propagate from the source to the detector. Therefore, some radiation may still propagate within the package from the source 2 to the detector 4 through the gap between the baffle 16 and the vertex 36. In order to mitigate this, a plurality of grooves 30 may be formed in the upper surface 20 of the lens module 8.

Figure 6:
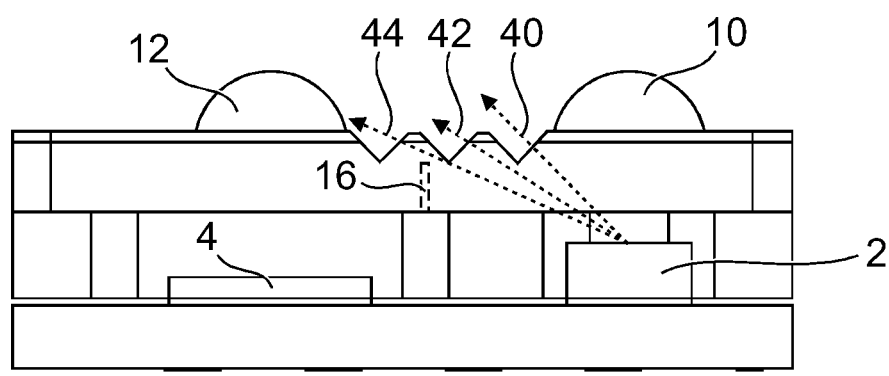
FIG. 6 is a section view of a sensor package comprising three grooves formed in a saw tooth configuration.

This is illustrated in FIG. 6, where three adjacent V-shaped grooves 30 arranged in a saw tooth structure are formed in the upper surface 20 of the lens module 8. The baffle 16 is shown in dotted lines. The three grooves 30 may be substantially identical (that is, the walls 32, 34 extend at right angles to each other from the groove vertex 36 to the upper surface 20 of the lens module 8). However, due to the lateral spacing between them, each of the grooves 30 substantially prevents the propagation of radiation along a different internal optical path within the optical package from the source 2 to the detector 4. Three such optical paths 40, 42, 44 are illustrated in FIG. 6. Forming a plurality of grooves 30 in the upper surface 20 of the lens module 8 is thus more effective at preventing internal light pollution within the proximity detector where a gap remains between the baffle 16 and the upper surface of the lens module 8. Preferably, the grooves 30 extend across the entire width of the lens module 8 to optimize the amount of stray radiation reflected or (transmitted out of the package) by the saw tooth structure.

The inventors have discovered that, optimally, the saw tooth structure is rotationally symmetric around the source 2. This rotational symmetry about the source ensures that radiation incident on the saw tooth structure is either reflected back towards the source or reflected out of the sensor package.

It will be appreciated that the saw-tooth structure is also an effective optical isolator, even when no gap is provided between the upper edge of the baffle and the bottom of the groove.

It will also be understood that the relative angle between the walls 32, 34 and the upper surface 20 of the lens module 8 can be "tuned" to direct stray radiation in a desired direction. For example, the walls may be angled to reflect incident radiation onto the opaque lens module mount 14 where it is absorbed, thus minimizing the amount of stray radiation within the package.

Each groove 30 may be designed to have one wall 32 which is substantially normal to a respective optical path and one wall which is substantially parallel to that optical path. The reasons for this are identical to those described above with respect to the single groove embodiment. However, it will be understood that the grooves may have any alternative suitable shape. For example, the grooves may alternatively be substantially U-shaped. The edges of the grooves may or may not be squared off.

Figure 7:
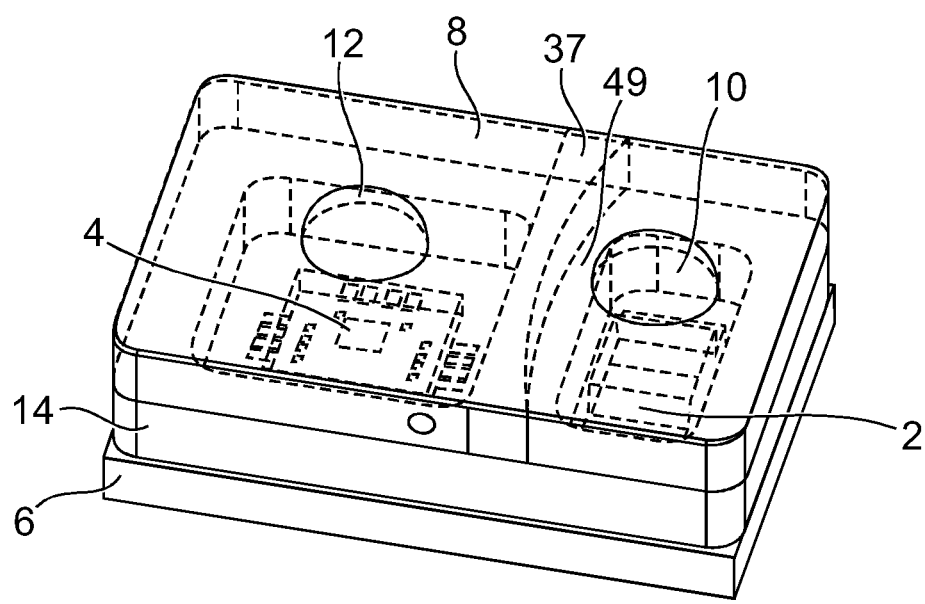
FIG. 7 is a perspective view of a sensor package comprising a curved baffle between the source and the detector.

In yet another alternative embodiment, the upper edge 22 of the baffle may be positioned as close as possible (accounting for manufacturing tolerances) to the upper surface 20 of the lens module 8 to minimize the gap between them (and thus minimize the amount of radiation passing through said gap). More preferably, the upper edge of the baffle is substantially flush with the upper surface 20 of the lens module 8 so that there is substantially no gap between them. This is illustrated in FIG. 7, where a curved baffle 37 between the source 2 and the detector 4 optically isolates the portion of the lens module 8 comprising the first lens 10 from the portion of the lens module 8 comprising the second lens 12. In this case, a groove 30 may not be required.

It is noted that the curved baffle 37 is concave with respect to the source 2. Thus, any radiation emitted by the source 2 which is incident on the baffle 37 is reflected back towards the source 2. It is further noted that the baffle 37 is mounted (or formed) on top of a base 49 which is positioned between the source 2 and the detector 4 and which is integrally formed with the lens module mount 14. More specifically, the base 49 extends between two longitudinal portions of the lens module mount 14 across the width of the package 1.

Figure 8:
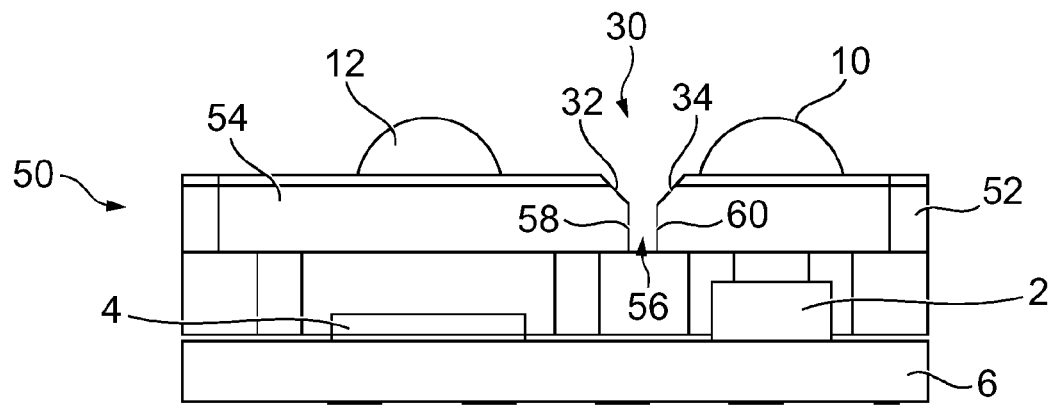
FIGS. 8 and 9 are section and perspective views of a sensor package comprising a V-shaped groove and a channel cut through the bottom of the groove.
Figure 9:
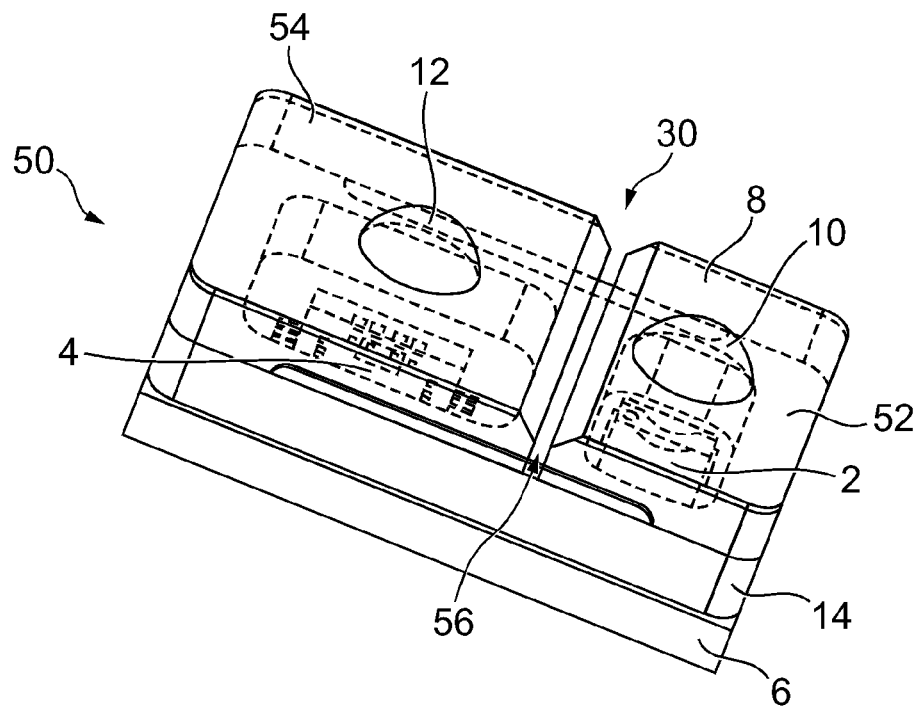

FIGS. 8 and 9 show an alternative sensor package 50 which is similar to the sensor package 1 described above. Identical features will be given the same reference numerals. The sensor package 50 does not comprise a baffle 16, 37 extending upwards from the pad 6 into the lens module 8. Rather, after the lens module 8 has been fitted (or formed) onto the lens module mount 14, a V-shaped groove 30 is formed in the upper surface 20 of the lens module 8. Next, a channel 56 is cut through the bottom of the groove 30 to split the lens module 8 into two separate parts 52, 54. The channel 56 and the groove 30 together act as an optical isolator for substantially preventing the internal propagation of radiation from the source 2 to the detector 4 within the sensor package. In particular, radiation emitted by the source 2 which is incident on the walls 58, 60 of the channel 56 or the walls 32, 34 of the groove 30 will exit the sensor package. In addition, the walls 58, 60 and 32, 34 of the channel 56 and the groove 30 respectively are shaped to prevent the exited radiation from being reflected back into the package 50. In the embodiment shown in FIGS. 8 and 9, the walls 58, 60 of the channel 56 are substantially perpendicular to the attachment pad 6. In addition, the walls 32, 34, which are perpendicular to each other, extend at obtuse angles from the upper edges of the channel walls 58, 60 respectively to the upper surface 20 of the lens module 8. The channel 56 may be formed after the lens module has been formed by cutting (sawing) through the upper surface of the lens module. Optionally, the channel 56 is back filled with an opaque filler capable of absorbing light transmitted from the source.

It will be appreciated that the lens module 8 is preferably cut into two parts 52, 54 after it has been fitted to the lens module mount 14 (as opposed to before it has been fitted to the mount 14) to ensure that the lenses 10, 12 (and thus the emission and incident cones of the source 2 and the detector 4) are properly aligned with each other.

Figure 10:
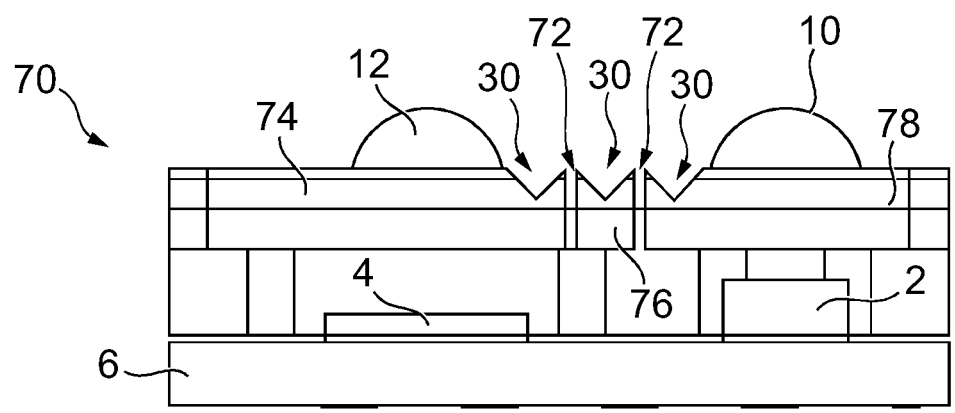
FIG. 10 is a section view of the sensor package of FIG. 6 with channels formed between adjacent pairs of grooves.

FIG. 10 shows another alternative sensor package 70 which is also similar to the sensor package 1 described above. Again, identical features will be given the same reference numerals. In a similar way to the embodiment of FIG. 6, three adjacent V-shaped grooves 30 are formed in the upper surface 20 of the lens module 8. However, the sensor package 70 does not comprise a baffle 16, 37 extending upwards from the attachment pad 6 into the lens module 8. Rather, two channels 72 are formed between adjacent pairs of grooves to split the lens module 8 into three separate parts 74, 76, 78. As before, the channels 72 are formed after the lens module 8 has been fitted to the lens module mount 14 to ensure that the lenses 10, 12 are properly aligned with each other.

The channels 72 and the grooves 30 together act as an optical isolator for substantially preventing the internal propagation of radiation from the source 2 to the detector 4 along an internal optical path within the sensor package 70. In a similar way to the embodiment of FIGS. 8 and 9, radiation from the source 2 which is incident on the walls of the channels 72 or the grooves 30 exits the sensor package 70. In addition, the walls of the channels 72 and the grooves 30 respectively are shaped to prevent the exited radiation from being reflected back into the package 70. By providing three grooves 30 and two channels 72, more effective optical isolation is achieved.

Figure 11:
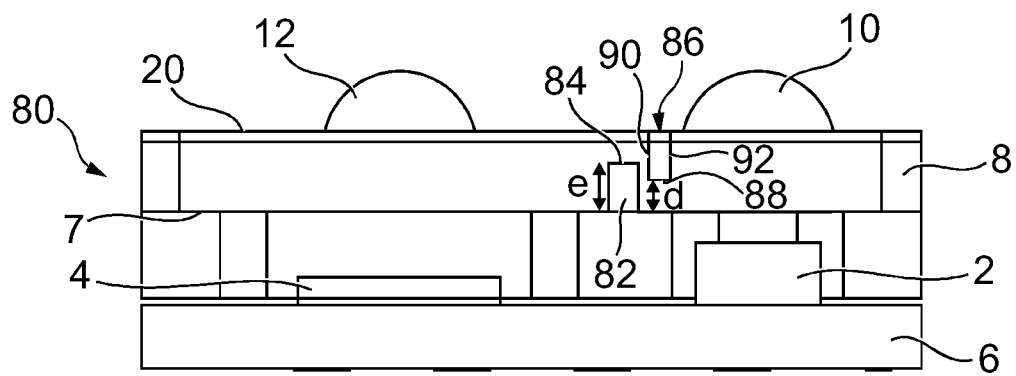
FIGS. 11 and 12 are section and perspective views respectively of a sensor package having a lens module with U-shaped groove and a baffle extending up into the lens module.
Figure 12:
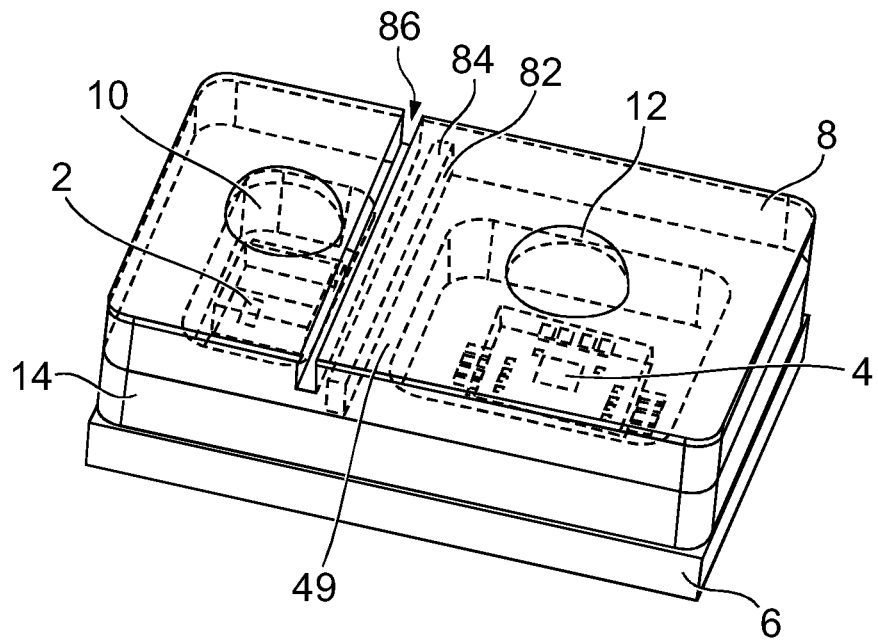

FIGS. 11 and 12 illustrate another alternative sensor package 80. An opaque baffle 82 (i.e. opaque to radiation emitted by the source 2) is provided between the source 2 and the detector 4. However, similar to the embodiment of FIG. 7, the baffle 82 extends upwards from a base 49 (which is positioned between the source 2 and the detector 4 and which is integrally formed with the lens module mount 14) into a recess in the lower surface 7 of the lens module 8. As above, the base 49 extends between two longitudinal portions of the lens module mount 14 across the width of the package 80. Also, the upper edge 84 of the baffle 82 is contained within the upper surface 20 of the lens module 8.

A U-shaped groove 86, comprising a pair of parallel walls 90, 92 extending upwards from a squared-off, flat groove bottom 88, is provided in the upper surface 20 of the lens module 8. The groove 86 is provided adjacent the recess formed in the lower surface 7 of the lens module 8 to accommodate the baffle 82. As shown in FIG. 11, the shortest distance 'd' between the bottom 88 of the groove 86 and the lower surface 7 of the lens module 8 is less than the shortest distance 'e' between the lower surface 7 of the lens module 8 and the upper edge 84 of the baffle 82. The baffle 82 and the U-shaped groove 86 together act as an optical isolator for substantially preventing the internal propagation of radiation between the source 2 and the detector 4 within the sensor package 80. Radiation incident on the baffle 82 may either be absorbed by the baffle or reflected out of the package or onto the lens module mount 14 (where it may be absorbed). In addition, radiation which exits the package 80 into the U-shaped groove 86 is reflected out of the package 80 by one or both of the parallel walls 90, 92. The groove 86 and the baffle 82 thus prevent the radiation from being totally internally reflected within the package from the source towards the detector.

Figure 13:
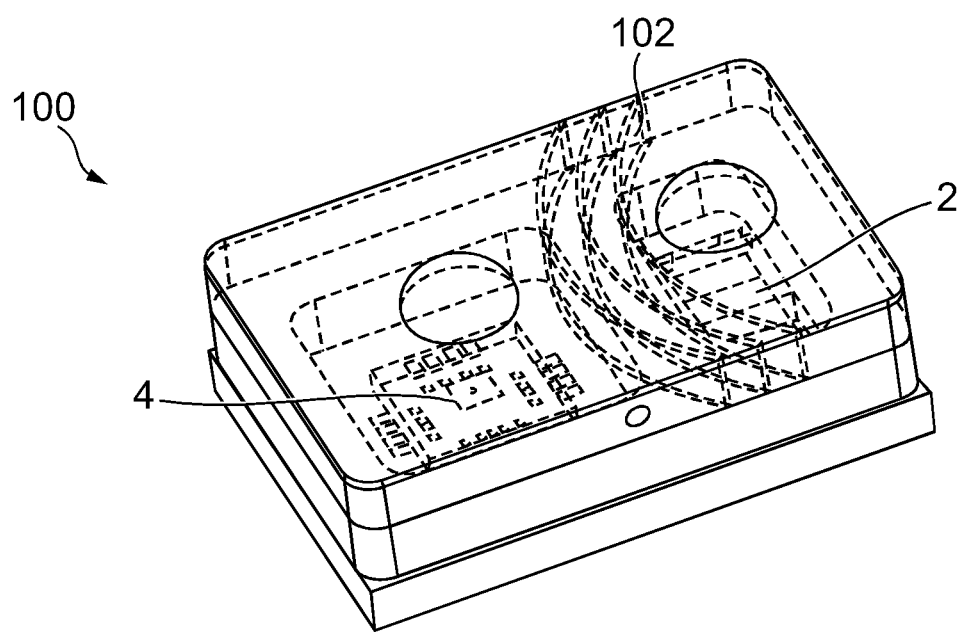
FIG. 13 shows a sensor package with three curved reflectors formed in the lens module.

FIG. 13 shows yet another alternative sensor package 100. Again, features identical to those described above will be given the same reference numerals. In this case, the lens module 8 comprises three curved reflectors 102 which are substantially concave with respect to the source 2. The reflectors 102 act as an optical isolator for substantially preventing the internal propagation of radiation within the package 100 from the source 2 to the detector 4. In this case, radiation emitted by the source 2 which is incident on any of the reflectors 102 will be reflected by their concave surfaces back towards the source 2. Preferably, the concave surfaces of the reflectors are also tilted upwards so that any radiation subject to multiple reflections between reflectors 102 is reflected towards the upper surface 20 of the lens module (and not back down towards the detector 4). For the same reason it is additionally preferable that the convex (rear relative the source) surfaces of the reflectors are also tilted upwards.

The reflectors 102 preferably extend from the lower surface 7 to the upper surface 20 of the lens module 8 to prevent radiation from being totally internally reflected around the reflectors 102 via either (or both of) the lower or upper surfaces 7, 20 of the lens module 8.

Figure 14:
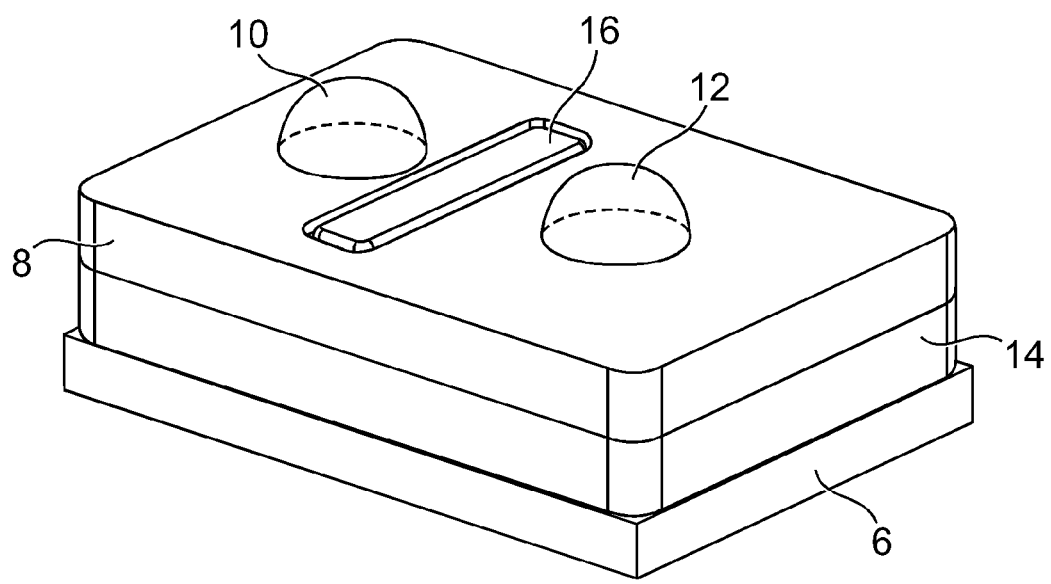
FIG. 14 shows the package of FIG. 2 where the lens module has been selectively blackened.

To further help reduce the amount of stray radiation within any of the packages described above, the lens module 8 (optionally including the lenses 10, 12) may be selectively blackened (i.e. a material opaque to the radiation emitted by the source 2 is selectively applied to the lens module 8/lenses 10, 12). This is illustrated in FIG. 14 which shows an adapted version of the package of FIG. 2, where the entire lens module 8, other than the lenses 10, 12, has been blackened. As any radiation incident on the blackened portions of the lens module is absorbed, the blackened portions of the lens module 8 act as an optical isolator for preventing the internal propagation of radiation within the package from the source 2 to the detector 4 by reflection via the lens module 8. The selective blackening of the lens module 8 also helps to control the size of the emission cone of the source 2 and the incident cone of the detector 4. This minimizes the amount of ambient radiation captured by the detector 4 during proximity sensing, which improves the signal to noise ratio of the captured proximity sensing signal, and thus the reliability of the sensor.

Figure 15:
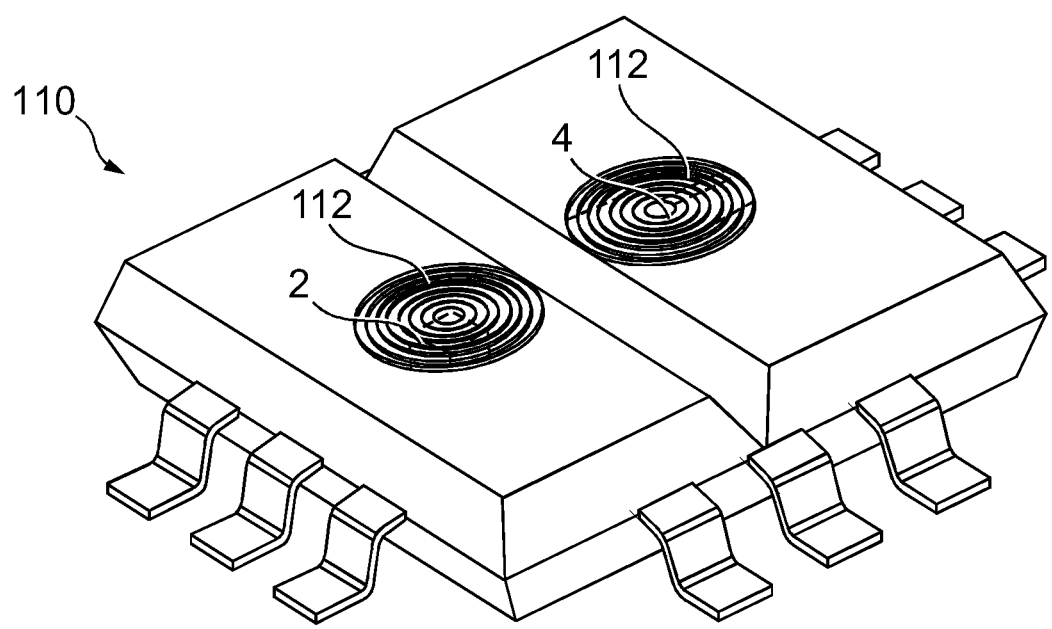
FIG. 15 shows a wire lead frame which has been selectively blackened.

As shown in FIG. 15, the selective blackening concept can equally be applied to any other package, such as a wire lead frame package 110. The concentric circles 112 shown in FIG. 15 represent waves emitted by the source 2 and captured by the detector 4.

Figure 16:
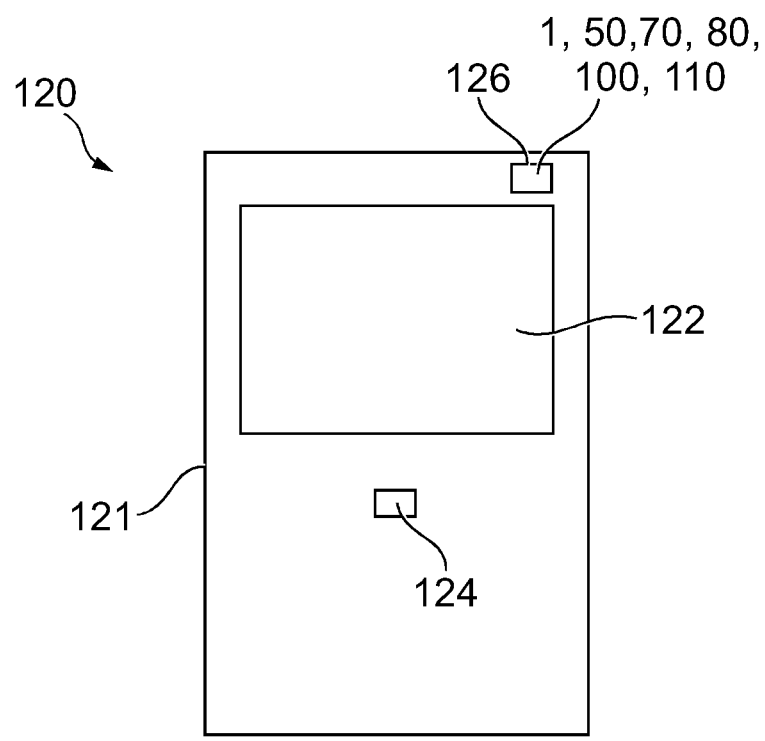
FIG. 16 is a schematic view of a mobile communications device.

The operation of the proximity sensors described above is best explained by means of an example. FIG. 16 shows a mobile communications device 120, such as a mobile phone, mobile smart-phone or PDA, having a housing 121 comprising a display 122, a controller 124 and one of the proximity sensors 1, 50, 70, 80, 100, 110 described above. The source 2 and detector 4 of the proximity sensor are provided under a single common window 126 within the device housing 121.

The proximity sensor can be used to detect the proximity of an object to the mobile communications device 120. This is done by: using the controller 124 to activate the radiation source 2 in order to emit radiation; detecting a portion of the radiation reflected by the object at the detector 4; and processing the reflected radiation with the controller 124 to calculate the proximity of the object to the mobile communications device 120, for example by using a direct time of flight measurement. It will be understood that any other suitable alternative proximity detection mechanism may be used, such as the Phase Shift Extraction Method (see below). If the object is found to be sufficiently close to the mobile communications device, it is assumed that the user is making a call and the controller 124 may switch off the display 122 to save power and/or deactivate one or more user-controls of the device to prevent the user from unintentionally instructing the device to perform a task.

As indicated above, an alternative to the direct time of flight method of proximity sensing is the Phase Shift Extraction Method. In this case, it is preferable that the detector 4 comprises one or more single photon avalanche detectors (SPADs). A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as 'Geiger Mode'.

It will be assumed in the description below that the detector 4 comprises one or more SPADs.

It is important to understand the range equation derivation as it indicates the ease of applicability of SPADs to phase extraction proximity detection.

Distance is determined from the speed of light and time of flight (TOF), as follows:

$$s = ct \quad (1)$$

where s is distance, c the speed of light and t is time.

For a proximity sensing system, the distance is doubled due to the fact there are send and receive paths. As such the distance measured in a ranging system s is given by:

$$s = \tfrac{1}{2} ct \quad (2)$$

The time shift component (='t') due to the photon TOF, is dependent on the modulation frequency applied to the radiation source and the phase shift magnitude of the waveform (compared to the radiation emitted from the radiation source).

$$t = \% \text{ shift of the returned waveform} \times t_{mod\_period}$$

and if $t_{mod\_period} = 1/f_{mod}$:

$$\Rightarrow t = \frac{\phi}{2\pi} o \frac{1}{f} \quad (3)$$

$$\Rightarrow t = \frac{\phi}{2\pi o f} \quad (4)$$

The units are in radians. Then by substituting the above equation back into the starting equation, the 'range equation' is expressed as:

$$\Rightarrow s = \frac{c o \phi}{4 \pi o f} \quad (5)$$

The critical component in this equation is φ, which is the unknown component of the % shift of the returned waveform. The following section discusses how this can be determined.

Figure 17:
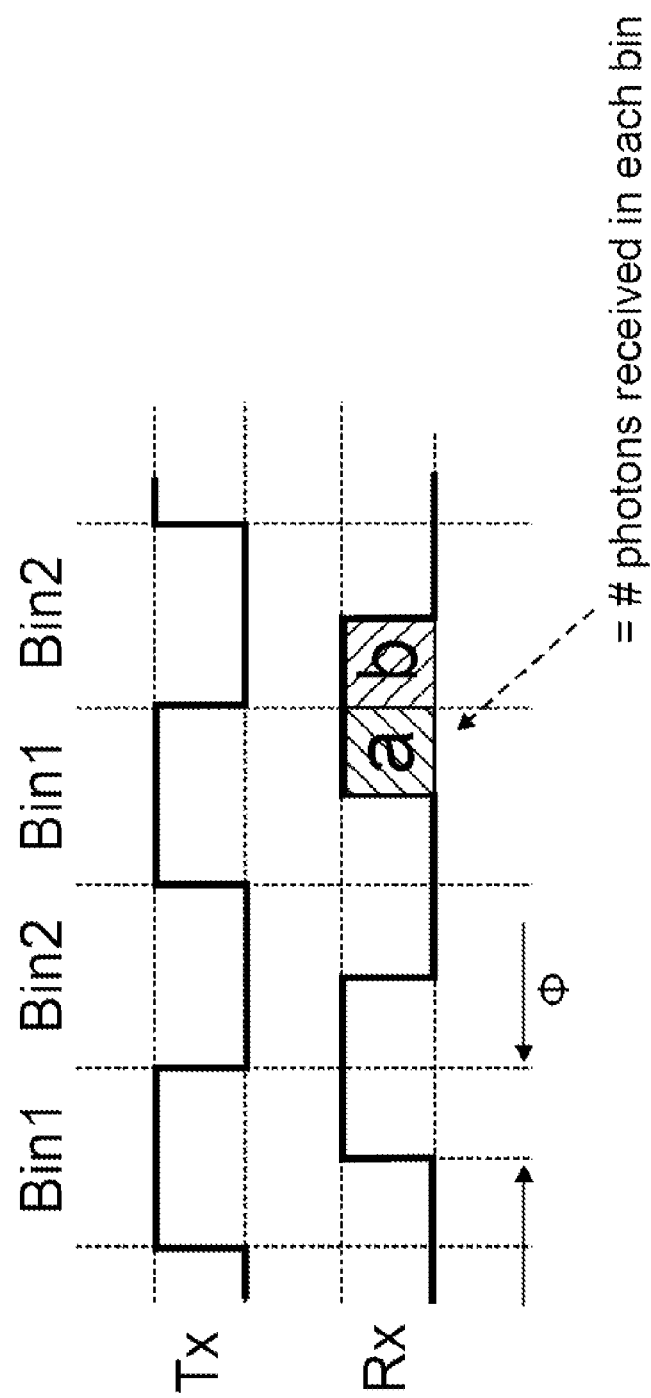
FIG. 17 is a diagram for illustrating the determination of phase shift in a SPAD, in accordance with an embodiment of the disclosure.

Since the values of c, f and π are all constants; the range result simply scales with φ, (the % shift of the received light waveform in relation to that which was transmitted). FIG. 17 demonstrates how φ may be determined for a system employing a square wave modulated radiation source. The transmitted and received waveforms are shifted from one another by φ. By measuring the photons that arrive in "a" and "b" in bins 1 and 2 respectively the value of φ can be determined as follows:

$$\frac{\phi}{2\pi} = \frac{b_{count}}{(a+b)_{count}} \quad (6)$$

In this type of system there is a range limit set by the radiation source modulation frequency, which is known as the unambiguous range. Photons received from targets that are further away than this range can introduce an aliasing error by erroneously appearing in a legitimate bin for a subsequent measurement. Since determination of range is enabled by the modulation applied to the source 2, it is desirable to maximize the number of edges of the modulation waveform in order to accumulate data for averaging purposes as fast as possible. However, a high modulation frequency may lower the unambiguous range and introduces more technical complexity in the driver circuitry of the radiation source. Therefore, two or more different modulation frequencies may be interleaved or used intermittently, so as to reduce or negate the impact of aliased photons via appropriate data processing.

Figure 18:
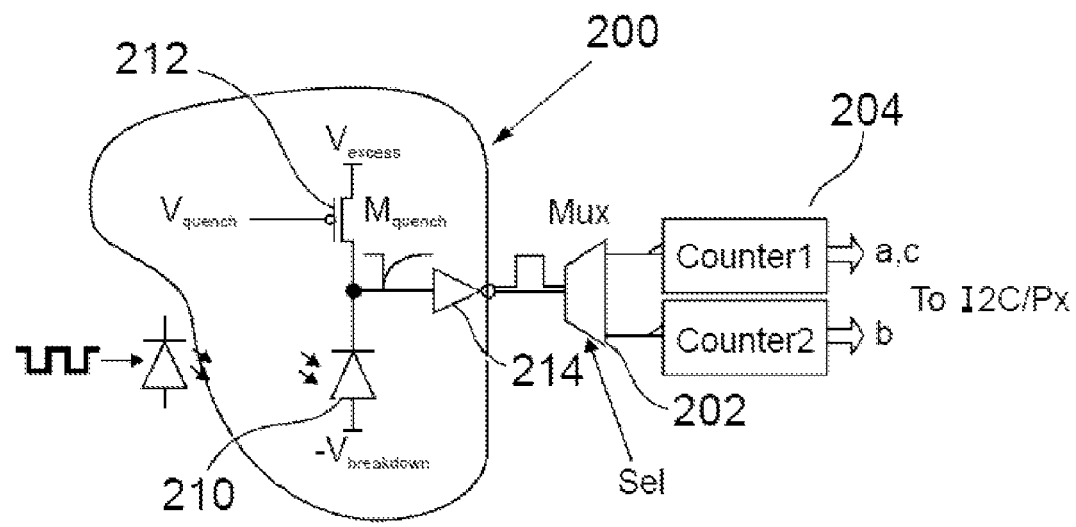
FIG. 18 is a diagram of a SPAD and associated timing diagram, in accordance with an embodiment of the disclosure.
Figure 18:
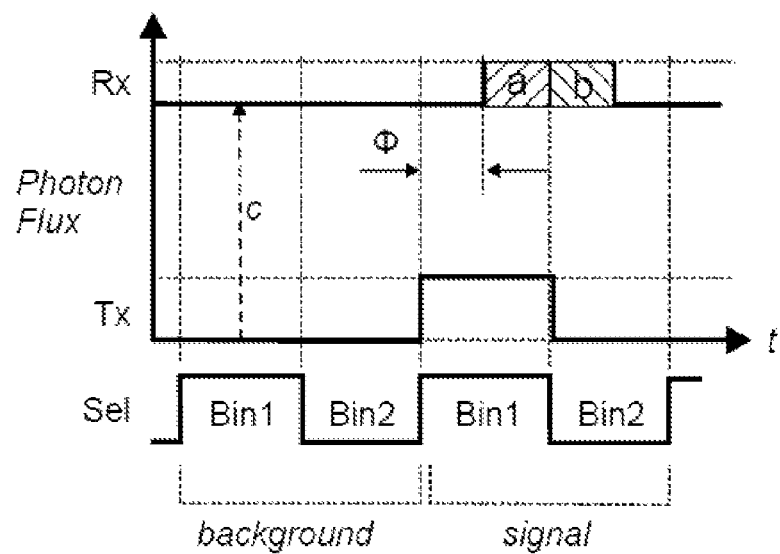

FIG. 18 illustrates a possible implementation of a SPAD based proximity sensor with an associated waveform diagram. FIG. 18 shows a SPAD 200 (which forms part of the detector 4) connected to a multiplexer 202. The output from the multiplexer passes through counters 1 and 2 (204). The SPAD shown generally at 200 is of a standard type, including a photodiode 210, a p-type MOSFET 212 and a NOT gate 214.

The timing waveforms are shown in such a way so as to represent the relative photon arrival magnitudes. It can be seen that an extra phase has been added to enable computation of the background ambient light level offset 'c', although this can be significantly reduced by the use of a narrow optical band-pass filter matched to the wavelength of the radiation source if necessary. The element 'c' is then accommodated in the computation of received light phase shift φ. This measurement of 'c' is then accommodated in the computation of received light phase shift φ. The computed results for a, b, c are determined and written into either a temporary memory store or an I2C register. The computation of the phase shift φ, is calculated as follows:

$$\phi = \frac{a_{count} - c}{(a+b)_{count} - 2c} \quad (7)$$

The predetermined selection of modulation frequency is performed by dedicated logic or host system which selects a suitable frequency or frequencies for the application of the range sensor. The proximity sensor of FIG. 18 is dependent on the amount of light that can be transmitted on to the scene, system power consumption and the target reflectivity.

Figure 19:
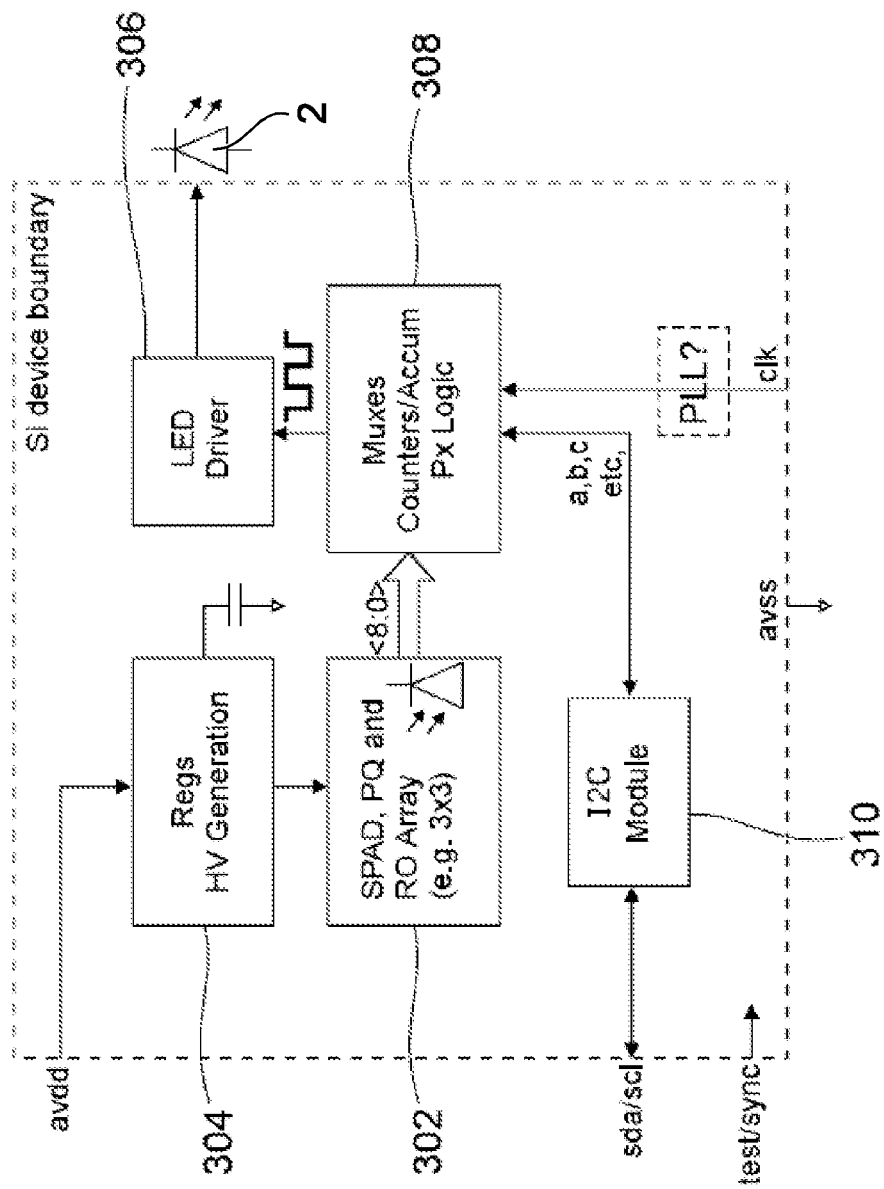
FIG. 19 is a block diagram of a proximity detector, in accordance with an embodiment of the disclosure.

A block diagram of the required elements for the proximity sensor is shown in FIG. 19 when the detector 4 comprises one or more SPADs. The proximity sensor includes a SPAD function and the quenching thereof in block 302. The quenching can be passive as shown or of any other suitable type. The bias voltage for the SPAD may be provided by a charge pump or any other suitable device 304. The sensor also includes the radiation source 2 (such as an LED or semiconductor laser) and an associated driver 306 for applying the required modulation to the radiation source 2.

The sensor may include a distance computation logic module to determine range. Alternatively this can be located in the mobile communications device 120, optionally as part of the controller 124. The sensor also includes multiplexers and counters 308 and a storage means 310, such as a I2C module. The sensor may also include a Phase Locked Loop (PLL) for clocking and subsequent timed signal generation purposes.

The power consumption of SPADs and their readout circuits is dependent on the incident photon arrival rate. The average power consumption of the proximity sensing function could be reduced by using power saving modes such as pulsed on/off operation, at a rate of ~10 Hz for example, at the expense of target motion distortion.

The SPADs may be implemented on a 1 $mm^2$ die size and the I2C module could also be implemented on an appropriate die. Optimally the detector 4 has a field of view of about 30°.

It should be noted that the terms "optical", "illumination" and "light" are intended to cover other wavelength ranges in the electromagnetic spectrum and are not limited to the visual spectrum.

While this detailed description has set forth some embodiments of the present disclosure, the appended claims cover other embodiments of the present disclosure which may differ from the described embodiments according to various modifications and improvements.

What is claimed is:

1. A proximity sensor comprising:
a sensor package comprising a lens module; a radiation source and a radiation detector housed within the sensor package, the lens module of the sensor package being positioned over the source and the detector; and an optical isolator adapted to substantially prevent internal propagation of radiation between the source and the detector within the sensor package,
the optical isolator comprising:
a baffle positioned within the sensor package between the source and the detector, said baffle comprising opposed side surfaces and an upper edge extending between the opposed side surfaces; and
a groove formed in an upper surface of the lens module, a bottom-most part of the groove being positioned adjacent to said upper edge of the baffle.

2. The proximity sensor of claim 1 wherein the bottom of the groove is positioned at or above and vertically aligned with the upper edge of the baffle.

3. The proximity sensor of claim 1 wherein the baffle is opaque to radiation emitted by the source.

4. The proximity sensor of claim 1 further comprising a substantially planar attachment pad housed within the sensor package.

5. The proximity sensor of claim 4 wherein the source and the detector are mounted on the attachment pad.

6. The proximity sensor of claim 4 wherein the baffle is mounted or formed on the attachment pad.

7. The proximity sensor of claim 1 wherein the lens module comprises a recess for receiving a portion of the baffle.

8. The proximity sensor of claim 7 further comprising a substantially planar attachment pad housed within the sensor package, wherein the baffle extends from the attachment pad into the lens module recess.

9. The proximity sensor of claim 1 wherein said groove comprises a plurality of separated grooves formed in the upper surface of the lens module, and wherein the bottom of at least one of the plurality of separated grooves is coplanar with the upper edge of the baffle.

10. The proximity sensor of claim 1 wherein the lens module comprises first and second lenses.

11. The proximity sensor of claim 1 wherein the lens module is formed as a single part.

12. The proximity sensor of claim 1 wherein one or more selected portions of the lens module are covered by a material opaque to radiation emitted by the radiation source.

13. The proximity sensor of claim 1 further comprising a substantially planar attachment pad housed within the sensor package, wherein the sensor package further comprises a lens module mount formed around a perimeter of the attachment pad and extending between the attachment pad and the lens module.

14. The proximity sensor of claim 13 wherein at least part of the lens module mount is opaque to radiation emitted by the radiation source.

15. The proximity sensor of claim 1 wherein the groove of the optical isolator has a V-shape configured to reflect radiation towards the lens module mount.

16. The proximity sensor of claim 1 wherein the radiation source is mounted at the bottom of a well comprising an aperture.

17. The proximity sensor of claim 16 further comprising a substantially planar attachment pad housed within the sensor package, wherein the well is formed on the attachment pad.

18. The proximity sensor of claim 16 wherein the lens module comprises a lens positioned over the aperture for collimating radiation emitted by the radiation source through the aperture.

19. The proximity sensor of claim 18 wherein the lens module further comprises a second lens positioned over the radiation detector.

20. The proximity sensor of claim 1 wherein the radiation detector comprises a pixel array.

21. The proximity sensor of claim 20 wherein the pixel array comprises a plurality of single photon avalanche detectors.

22. The proximity sensor of claim 1 further comprising common circuitry housed within the sensor package for controlling the source and the detector.

23. The proximity sensor of claim 1 wherein the optical isolator substantially prevents the propagation of radiation between the source and the detector by total internal reflection within the sensor package.

24. A method of manufacturing a proximity sensor comprising:
   (a) housing a radiation source and a radiation detector within a sensor package;
   (b) fitting or forming a lens module over the source and the detector; and
   (c) forming an optical isolator adapted to substantially prevent the internal propagation of radiation between the radiation source and the radiation detector within the sensor package, wherein forming comprises: mounting or forming a baffle between the source and the detector, said baffle comprising opposed side surfaces and an upper edge extending between the opposed side surfaces, and forming one or more grooves in an upper surface of the lens module, the bottom-most part of at least one of the one or more grooves being adjacent said upper edge of the baffle.

25. The method of claim 24 wherein housing comprises bonding the source and the detector to a substantially planar attachment pad housed within the package.

26. The method of claim 25 wherein forming comprises bonding or forming the baffle on the attachment pad.

27. The method of claim 25 further comprising forming a well on the attachment pad before step (a) and wherein (a) housing the radiation source comprises mounting the radiation source at the bottom of the well.

28. The method of claim 24 comprising forming the lens module by encapsulating the source and the detector in a material which is transparent to radiation emitted by the source.

29. The method of claim 28 wherein the encapsulant material comprises silicone or epoxy.

30. The method of claim 24 wherein the source is a bare die light emitting diode.

31. The method of claim 24 wherein the lens module is formed as a single part.

32. The method of claim 24 wherein the lens module comprises a first lens positioned over the radiation source and a second lens positioned over the radiation detector.

33. The method of claim 24 further comprising covering selected portions of the lens module with material opaque to radiation emitted by the radiation source.

34. A mobile communications device comprising: a proximity sensor comprising: a sensor package comprising a lens module; a radiation source and a radiation detector housed within the sensor package, the lens module of the sensor package being positioned over the source and the detector; and an optical isolator adapted to substantially prevent the internal propagation of radiation between the source and the detector within the sensor package, the optical isolator comprising:
   a baffle comprising opposed side surfaces and an upper edge extending between the opposed side surfaces; and
   a groove formed in the upper surface of the lens module, the bottom-most part of the groove being adjacent said upper edge of the baffle.

35. A method of proximity detection comprising:
   (a) providing a source and a detector within a single sensor package, the sensor package comprising a lens module positioned over the source and the detector;
   (b) emitting radiation from the source;
   (c) substantially preventing the internal propagation of radiation between the source and the detector within the sensor package using an optical isolator comprising: a baffle including opposed side surfaces and an upper edge extending between the opposed side surfaces; and a groove formed in the upper surface of the lens module, the bottom-most part of the groove being adjacent said upper edge of the baffle;
   (d) illuminating an object outside the sensor package with a portion of the emitted radiation;
   (e) detecting a portion of the emitted radiation reflected by the object; and
   (f) processing the detected radiation to determine the proximity of the object to the sensor package.

* * * * *